United States Patent
Liu et al.

(10) Patent No.: US 6,509,249 B1
(45) Date of Patent: Jan. 21, 2003

(54) METHOD OF FABRICATING SHALLOW TRENCH ISOLATION

(75) Inventors: Yuhturng Liu, Liu-Kuei Hsiang (TW); Chi-Tung Huang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/158,748

(22) Filed: May 28, 2002

(51) Int. Cl.[7] ............................................... G01R 31/26
(52) U.S. Cl. ......................... 438/424; 438/16; 438/692
(58) Field of Search ............................... 438/424, 404, 438/16, 7, 692, 970

(56) References Cited

U.S. PATENT DOCUMENTS

| | | | |
|---|---|---|---|
| 6,287,879 B1 * | 9/2001 | Gonzales et al. | 438/16 |
| 6,290,572 B1 * | 9/2001 | Hofmann | 451/5 |
| 6,309,555 B1 * | 10/2001 | Chen | 216/85 |
| 6,361,646 B1 * | 3/2002 | Bibby et al. | 156/345 |

OTHER PUBLICATIONS

"Control of Dielectric Chemical Mechanical Polishing (CMP) Using an Interferometry Based Endpoint Sensor." Fang, S.J. et al. Interconnect Technology Conference, 1998. 1998 Interntional Proceedings of the IEEE, pp 76–78.*

"Process Control and Monitoring with Laser Interferometry Based Endpoint Detection in Chemical Mechanical Planarization." Chan et al. Advanced Semiconductor Manufacturing Conference and Workshop, 1998. 1998 SEMI/IEEE., pp 377–384.*

* cited by examiner

Primary Examiner—Vu A. Le
Assistant Examiner—Beth E. Owens
(74) Attorney, Agent, or Firm—J.C. Patents

(57) ABSTRACT

A method of fabricating a shallow trench isolation structure. A pad oxide layer, a mask layer, a dielectric anti-reflection coating layer and a cap oxide layer are formed on a substrate sequentially. A trench is formed in the substrate. A liner oxide layer is formed along a surface of the trench. An isolation layer is formed over the substrate to fill the trench. Using the mask layer as a polishing endpoint, the insulation layer, the dielectric anti-reflection coating layer and the cap oxide layer over the mask layer are removed. The thickness of the mask layer is controlled within a first fixed range, and the thickness of the dielectric anti-reflection coating layer is controlled, within a second fixed range, such that the light source of the optical endpoint detection system can produce a maximum reflected light signal. The mask layer and the pad oxide layer are then removed.

18 Claims, 5 Drawing Sheets

METHOD OF FABRICATING SHALLOW TRENCH ISOLATION

BACKGROUND OF THE INVENTION

1. Field of the Invention

The invention relates in general to a method of fabricating a device isolation structure, and more particularly, to a method of fabricating a shallow trench isolation (STI) structure with an enhanced stability of endpoint detection.

2. Description of the Related Art

For the well-developed integrated circuits, to further shrink the device and increase the integration are the consequent orientations and important topics for industry. As the device dimensions decrease, the integration continuously increases, the difficulty of device isolation technique becomes more significant. The field oxide formed by local oxidation (LOCOS) is restricted for further shrinkage due to its bird's beak characteristics. Shallow trench isolation structure are thus developed and widely applied, especially in the sub-half micron integrated circuit fabrication process.

In the conventional method of fabricating the shallow trench isolation structure, a pad oxide layer and a silicon nitride mask layer are formed on a substrate first. A steep trench is then formed in the substrate using anisotropic dry etching. The trench is filled with an insulation layer. The excess insulation is removed using chemical-mechanical polishing, such that the remaining insulation layer in the trench is used as the device isolation structure. The mask layer and the pad oxide layer are then removed.

In the conventional method described above, no method related to the stability of endpoint detection has been proposed. As the device dimension shrinks and the integration grows, the silicon nitride mask layer used as the polishing endpoint is becoming much thinner. The stability of endpoint detection is thus easily affected to cause the decreased reliability.

SUMMARY OF THE INVENTION

The invention provides a method of fabricating a shallow trench isolation structure with an enhanced stability of endpoint detection. A pad oxide layer, a mask layer, a dielectric anti-reflection coating (DARC) layer and a cap oxide layer are formed on a substrate. A patterned photoresist layer is formed on the cap oxide layer. Using the patterned photoresist layer as a mask, the cap oxide layer, the dielectric anti-reflection layer, the mask layer, the pad oxide layer, and the substrate are etched to form a trench in the substrate. The patterned photoresist layer is removed. A liner oxide layer is formed along a surface of the trench. An insulation layer is formed over the substrate to fill the trench. Using the mask layer as a polishing endpoint, a chemical-mechanical polishing step is performed to remove the excess insulation layer, the cap oxide layer and the dielectric anti-reflection coating layer over the mask layer. The thickness of mask layer is controlled within a first fixed range, while the dielectric anti-reflection coating layer is controlled within a second fixed range. Thus, a light source used in an optical endpoint detection system has the maximum reflected light signal. The mask layer and the pad oxide layer are then removed.

To achieve the objective of stablizing the endpoint detection, the invention accommodates the structure of the mask layer and the dielectric anti-reflection coating layer, that is, by controlling the thickness of the mask layer and the dielectric anti-reflection coating layer within a specific range. The substrate reflectivity for the endpoint detection is thus increased. The larger the substrate reflectivity is, the higher the reliability of the endpoint detection is. Therefore, the objective of having the stable endpoint detection for the fabrication process of the shallow trench isolation structure can be achieved.

Both the foregoing general description and the following detailed description are exemplary and explanatory only and are not restrictive of the invention, as claimed.

DESCRIPTION OF THE PREFERRED EMBODIMENTS

FIG. 1A to FIG. 1E are cross-sectional views showing the fabricating process of a shallow trench isolation structure.

Figure 1A:
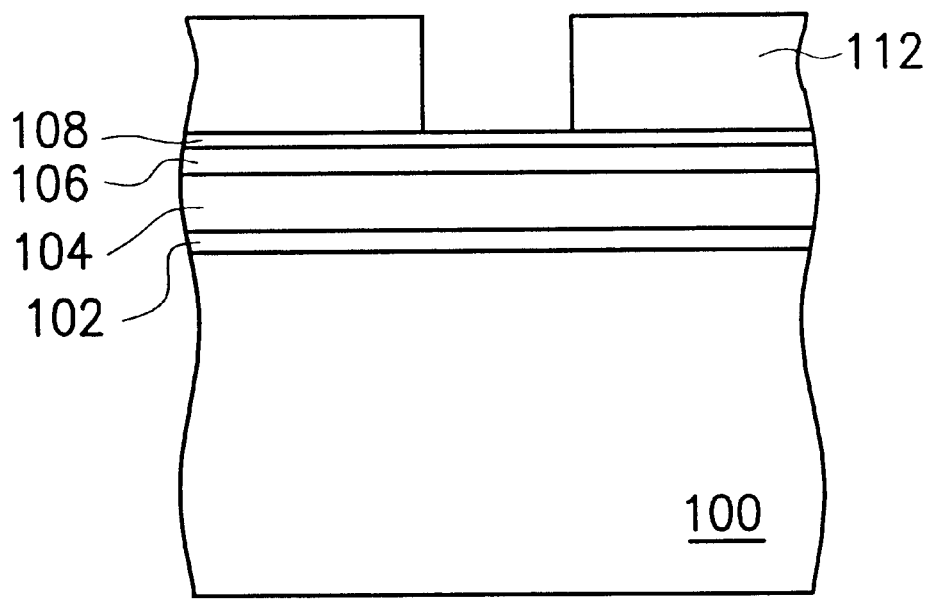
FIG. 1A to FIG. 1E are cross-sectional views showing the fabrication process for a shallow trench isolation structure.

In FIG. 1A, a pad oxide layer 102, a mask layer 104, a dielectric anti-reflection coating layer 106 and a cap oxide layer 108 are formed on a substrate 100. A patterned photoresist layer 1 12 is formed on the cap oxide layer 108. The pad oxide layer 102 is formed to protect the substrate 100 from being damaged by the subsequent process. The method for forming the pad oxide layer 102 comprises thermal oxidation, for example. The mask layer 104 is formed of a silicon nitride by chemical vapor deposition, for example. The dielectric anti-reflection coating layer 106 reduces errors during the exposure of the photoresist layer 112. The cap oxide layer 108 is used as a reinforcing layer of the dielectric anti-reflection coating layer 106 to enhance the anti-reflection function.

To obtain a stable endpoint detection, the substrate reflectivity has to be increased. In this invention, a structure of a mask layer 104 and a dielectric anti-reflection coating layer 106 with a thickness controlled within a fixed range are formed for achieving such an objective. For example, when the wavelength for detecting the light source for an optical endpoint detection system is 637 nm, the mask layer 104 is about 1200 Å to about 1800 Å, and preferably, about 1200 Å to about 1600 Å, while the dielectric anti-reflection coating layer 106 is about 450 Å to about 1050 Å. With the combined thickness of the mask layer 104 and the dielectric anti-reflection coating layer 106 controlled, an optimal reflected light signal can be obtained for the light source used in the optical endpoint detection system.

Figure 1B:
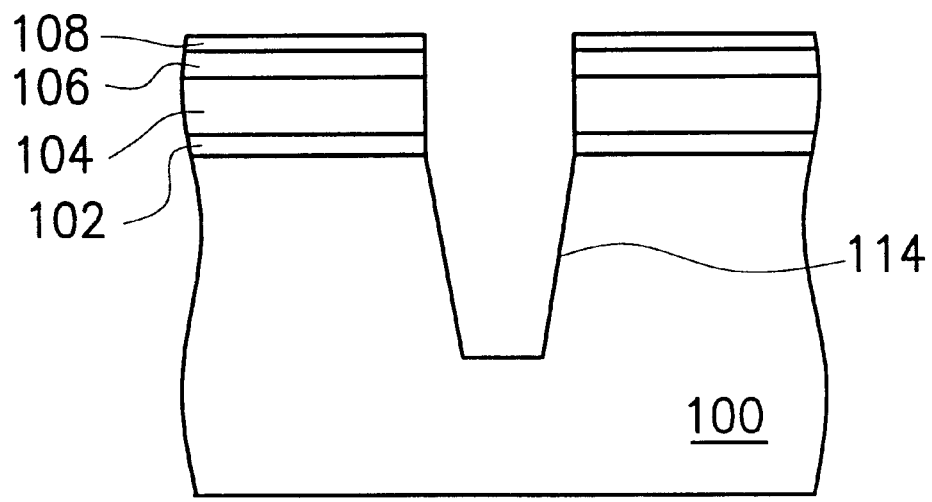

In FIG. 1B, using the photoresist layer 112 as a mask, the cap oxide layer 108, the dielectric anti-reflection coating layer 106, the mask layer 104 and the pad oxide layer 102 are etched. The etching step is not stopped until a trench 114 is formed in the substrate 100. The etching step includes anisotropic etching. The photoresist layer 112 is then removed.

Figure 1C:
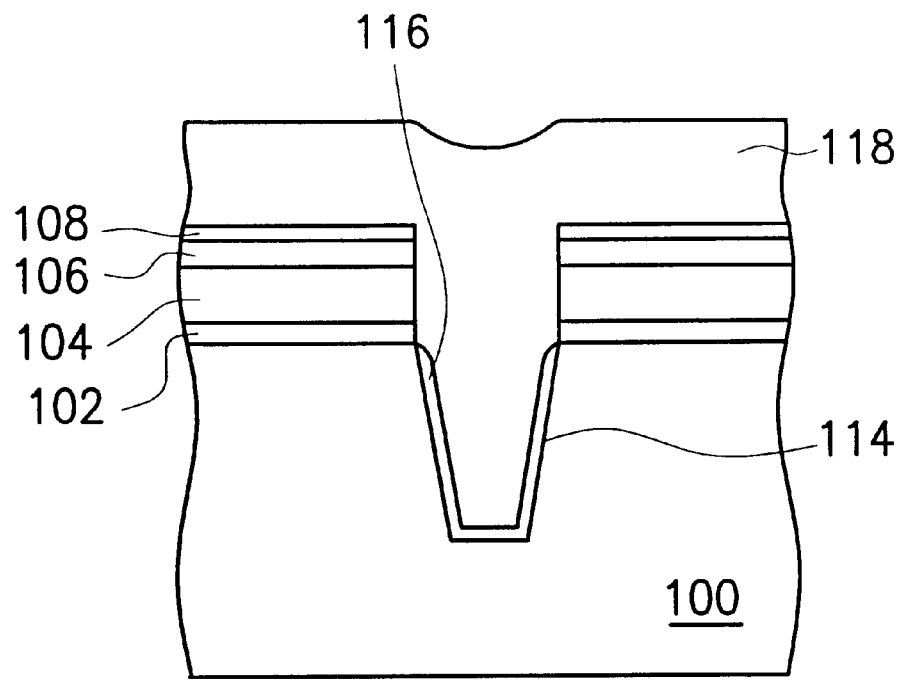

In FIG. 1C, a liner oxide layer 116 is formed along a surface of the trench 114. An insulation layer 118 is formed over the substrate 100 to fill the trench 114. The insulation layer 118 includes a silicon oxide layer formed by high density plasma chemical vapor deposition (HDPCVD).

Figure 1D:
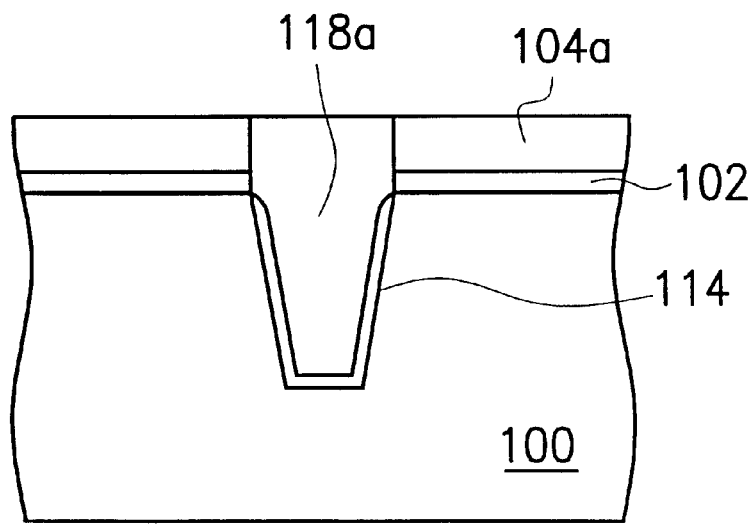

In FIG. 1D, using the mask layer 104 as a polishing end point, the insulation layer 118, the dielectric anti-reflection coating layer 106 and the cap oxide layer 108 are removed by chemical-mechanical polishing which uses an optical endpoint detection system for detecting the polishing end point. As the light source used in the optical endpoint detection system has an optimal reflection light signal by controlling the thickness of the mask layer 104 and the dielectric anti-reflection coating layer 106, the reflectivity of the substrate 100 is increased. Therefore, a stable of endpoint detection for this process of forming the shallow trench isolation can be obtained, and consequently, the reliability is improved. After the chemical mechanical polishing process, the insulation layer 118a remains only in the trench 114, while the mask layer 104 is thinned to become the mask layer marked with the numeral reference 104a.

Figure 1E:
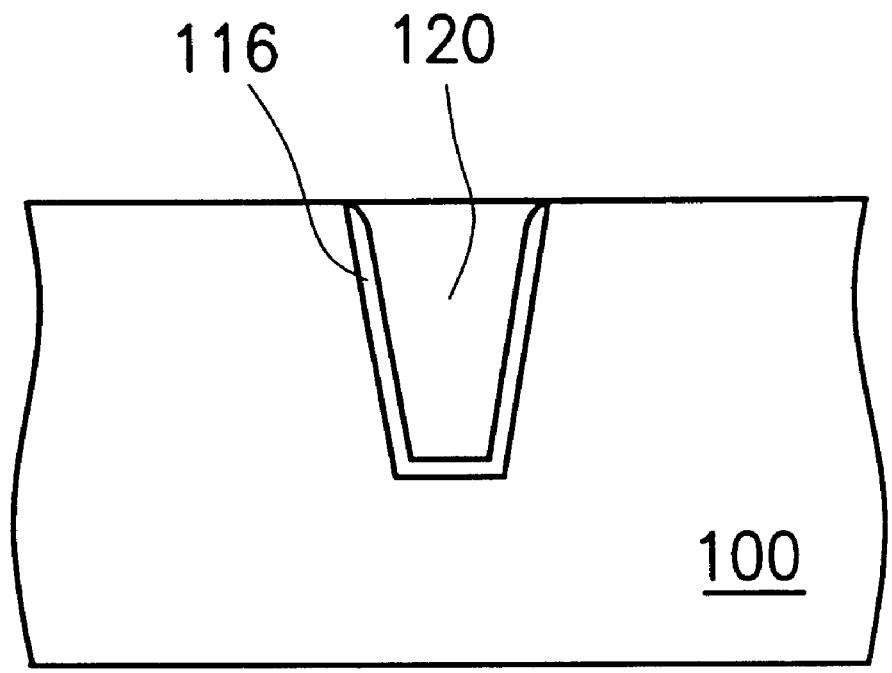

In FIG. 1E, the mask layer 104a is removed. When the material of the mask layer 104a includes silicon nitride, a hot phosphoric acid can be used for the removal. The pad oxide layer 102 is also removed to form the shallow trench isolation structure 120 using hydrofluoric acid or hydrogen fluoride (HF), for example.

Figure 2A:
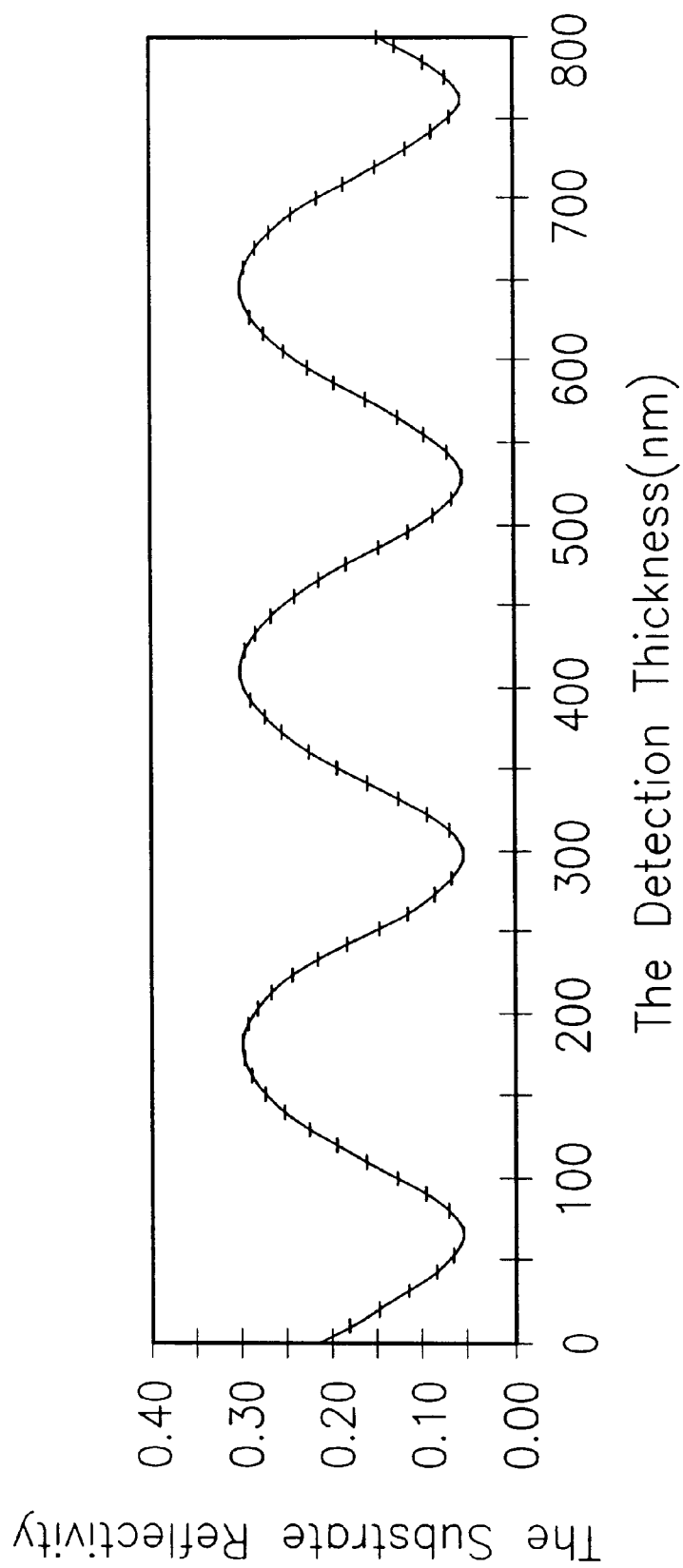
FIG. 2A is a simulation of substrate reflectivity for the endpoint detection in the fabrication process as shown in FIG. 1A to FIG. 1E.
Figure 2B:
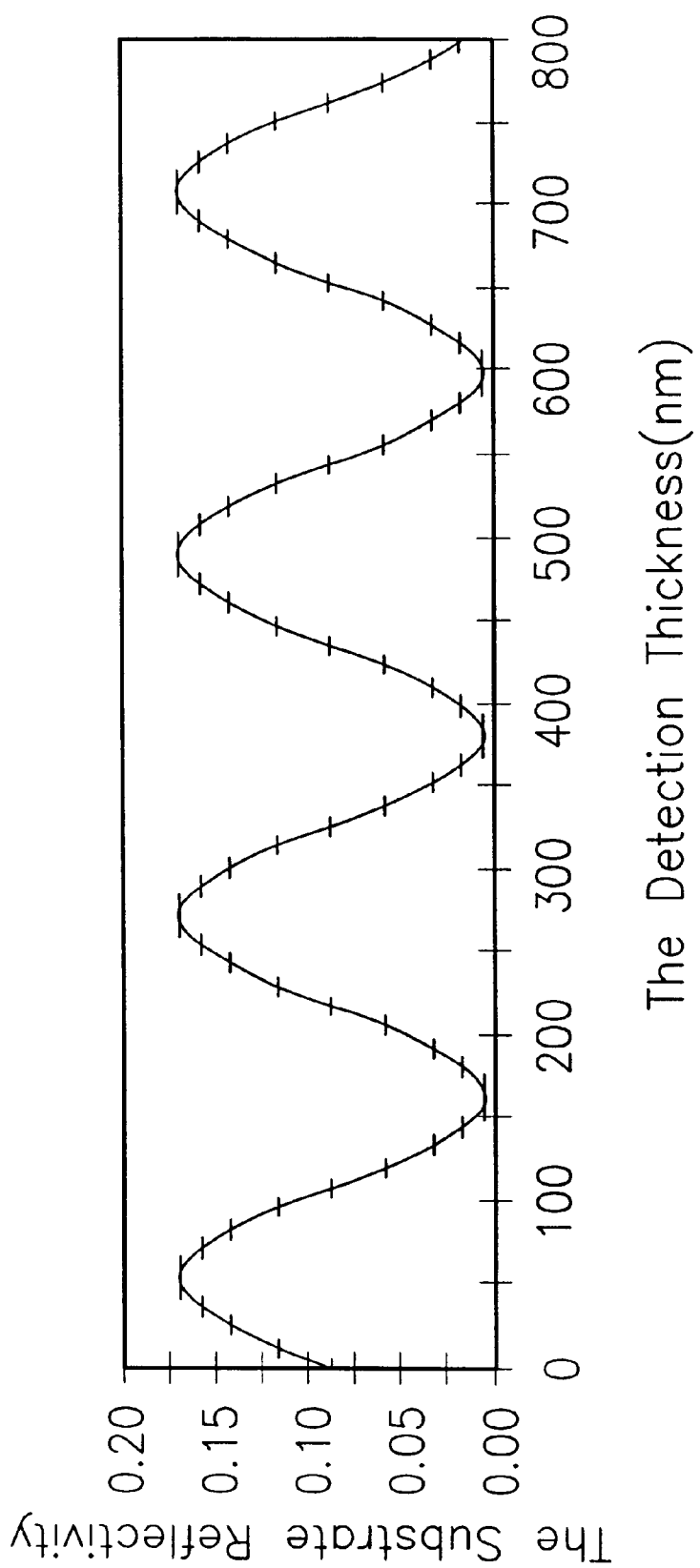
FIG. 2B is a simulation of substrate reflectivity for the endpoint detection in the conventional fabrication process of a shallow trench isolation structure.

To prove the invention can increase the reflectivity of the substrate, a simulation of the substrate reflectivity for the endpoint detection in the process as shown in FIGS. 1A to 1E is shown in FIG. 2A. FIG. 2B simulates the substrate reflectivity for the endpoint detection with respect to the conventional structure of the mask layer and the dielectric anti-reflection coating layer.

In FIG. 2A, when the wavelength of the light source used in the optical endpoint detection system is 637 nm, the thickness of the mask layer 104 is between 1200 Å and 1800 Å, and the thickness of the dielectric anti-reflection coating layer 106 is between 450 Å to 1050 Å. The relationship between the reflectivity of the substrate 100 and the detection thickness is shown as FIG. 2A. The amplitude of the reflectivity is about 0.25.

In FIG. 2B, a relationship between the substrate reflectivity and the detection thickness of the conventional structure of the mask layer and the dielectric anti-reflection coating layer for endpoint detection is shown. As shown in FIG. 2B, the reflectivity has an amplitude of about 0.175, which is less than 0.25 obtained by the present invention.

Therefore, the present invention is characterized in the structure of the mask layer and the dielectric anti-reflection coating layer to obtain an enhanced substrate reflectivity, so as to obtain a stable endpoint detection in a fabrication process of shallow trench isolation. The reliability can also be enhanced.

Other embodiments of the present invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a shallow trench isolation structure, comprising:

providing a substrate;

forming a pad oxide layer on the substrate;

forming a mask layer on the pad oxide layer;

forming a dielectric anti-reflection coating layer on the mask layer;

forming a cap oxide layer on the dielectric anti-reflection coating layer;

forming a patterned photoresist layer on the cap oxide layer;

etching the cap oxide layer, the dielectric anti-reflection layer, the mask layer, the pad oxide layer, and the substrate using the photoresist layer as a mask to form a trench in the substrate;

removing the photoresist layer;

forming a liner oxide layer over a surface of the trench;

forming an insulation layer over the substrate to fill the trench;

using chemical-mechanical polishing with the mask layer as a polishing endpoint to remove the insulation layer, the cap oxide layer, and the dielectric anti-reflection coating layer over the mask layer, wherein the chemical-mechanical polishing process uses an optical endpoint detection system for endpoint detection;

removing the mask layer; and removing the pad oxide layer;

wherein the mask layer has a thickness controlled within a first fixed range, and the dielectric anti-reflection coating layer has a thickness controlled within a second fixed range, such that an optimal reflected light signal of a light source used in the optical endpoint detection system is obtained.

2. The method according to claim 1, wherein the step of forming the mask layer comprises a step of forming a silicon nitride layer.

3. The method according to claim 2, wherein the step of using the optical endpoint detection system comprises using a light source with a wavelength of 637 nm.

4. The method according to claim 3, wherein the step of forming the mask layer comprises forming the mask layer with a thickness ranged between about 1200 Å and about 1800 Å.

5. The method according to claim 3, wherein the step of forming the mask layer comprises forming the mask layer with a thickness ranged between about 1200 Å and about 1600 Å.

6. The method according to claim 3, wherein the step of forming the dielectric anti-reflection coating layer comprises forming the dielectric anti-reflection coating layer with a thickness ranged between about 450 Å and about 1050 Å.

7. The method according to claim 1, wherein the step of forming the insulation layer includes a step of high density plasma chemical vapor deposition.

8. The method according to claim 1, wherein the step of removing the mask layer includes using hot phosphoric acid.

9. The method according to claim 1, wherein the step of removing the pad oxide layer includes a step of using hydrofluoric acid or hydrogen fluoride.

10. A method of fabricating a shallow trench isolation structure, comprising:

providing a substrate;

forming a pad oxide layer on the substrate;

forming a mask layer on the pad oxide layer;

forming a dielectric anti-reflection coating layer on the mask layer;

forming a cap oxide layer on the dielectric anti-reflection coating layer;

forming a patterned photoresist layer on the cap oxide layer;

etching the cap oxide layer, the dielectric anti-reflection layer, the mask layer, the pad oxide layer, and the substrate using the photoresist layer as a mask to form a trench in the substrate;

removing the photoresist layer;

forming a liner oxide layer over a surface of the trench;

forming an insulation layer over the substrate to fill the trench;

using chemical-mechanical polishing with the mask layer as a polishing endpoint to remove the insulation layer, the cap oxide layer, and the dielectric anti-reflection coating layer over the mask layer, wherein the chemical-mechanical polishing process uses an optical endpoint detection system for endpoint detection;

removing the mask layer; and removing the pad oxide layer;

wherein the mask layer has a thickness controlled within a first fixed range such that an optimal reflected light signal of a light source used in the optical endpoint detection system is obtained.

11. The method according to claim 10, wherein the step of forming the mask layer comprises a step of forming a silicon nitride layer.

12. The method according to claim 11, wherein the step of using the optical endpoint detection system comprises using a light source with a wavelength of 637 nm.

13. The method according to claim 12, wherein the step of forming the mask layer comprises forming the mask layer with a thickness ranged between about 1200 Å and about 1800 Å.

14. The method according to claim 12, wherein the step of forming the mask layer comprises forming the mask layer with a thickness ranged between about 1200 Å and about 1600 Å.

15. The method according to claim 12, wherein the step of forming the dielectric anti-reflection coating layer comprises forming the dielectric anti-reflection coating layer with a thickness ranged between about 450 Å and about 1050 Å.

16. The method according to claim 10, wherein the step of forming the insulation layer includes a step of high density plasma chemical vapor deposition.

17. The method according to claim 10, wherein the step of removing the mask layer includes using hot phosphoric acid.

18. The method according to claim 10, wherein the step of removing the pad oxide layer includes a step of using hydrofluoric acid or hydrogen fluoride.

* * * * *